United States Patent
Zhang

(10) Patent No.: US 9,633,834 B2
(45) Date of Patent: Apr. 25, 2017

(54) PHOTOLITHOGRAPHIC METHOD FOR FORMING A COATING LAYER

(71) Applicant: Semiconductor Manufacturing International (Shanghai) Corporation, Shanghai (CN)

(72) Inventor: Guowei Zhang, Shanghai (CN)

(73) Assignee: SEMICONDUCTOR MANUFACTURING INTERNATIONAL (SHANGHAI) CORPORATION, Shanghai (CN)

(*) Notice: Subject to any disclaimer, the term of this patent is extended or adjusted under 35 U.S.C. 154(b) by 45 days.

(21) Appl. No.: 14/660,183

(22) Filed: Mar. 17, 2015

(65) Prior Publication Data

US 2015/0279662 A1    Oct. 1, 2015

(30) Foreign Application Priority Data

Mar. 25, 2014  (CN) ............................ 2014-10114618

(51) Int. Cl.
*B05D 3/10* (2006.01)
*H01L 21/02* (2006.01)
*B05D 1/00* (2006.01)
*H01L 21/67* (2006.01)
*G03F 7/16* (2006.01)

(52) U.S. Cl.
CPC ........ *H01L 21/02104* (2013.01); *B05D 1/005* (2013.01); *G03F 7/162* (2013.01); *G03F 7/168* (2013.01); *H01L 21/6715* (2013.01)

(58) Field of Classification Search
CPC ............ B05D 1/005; H01L 21/6715; H01L 21/02104; G03F 7/162; G03F 7/168
USPC .......... 427/240, 425; 118/52, 320; 438/780, 438/782
See application file for complete search history.

(56) References Cited

U.S. PATENT DOCUMENTS

| 2005/0245005 A1* | 11/2005 | Benson | ............... G03F 7/70341 438/127 |
| 2012/0315578 A1* | 12/2012 | Lee | ......................... G03F 7/168 430/270.1 |
| 2014/0273509 A1* | 9/2014 | Wang | .................. H01L 21/6715 438/760 |

* cited by examiner

*Primary Examiner* — Kirsten Jolley
(74) *Attorney, Agent, or Firm* — Anova Law Group, PLLC

(57) ABSTRACT

A method for forming a coating layer includes spraying coating material having a first flowability onto a substrate; performing a first spin coating process with a first spin speed to form an initial coating layer; and performing a first baking process to the initial coating layer to form a first material layer having a second flowability and a second material layer having a third flowability. The third flowability is less than the first flowability but larger than the second flowability, which is less than the first flowability. Further, the method includes performing a second spin coating process with a second spin speed to drive the coating material in the second material layer flowing on the surface of the first material layer to form a third material layer with a uniform thickness, and performing a second baking process to form a final coating layer on the substrate.

20 Claims, 7 Drawing Sheets

PHOTOLITHOGRAPHIC METHOD FOR FORMING A COATING LAYER

CROSS-REFERENCES TO RELATED APPLICATIONS

This application claims the priority of Chinese patent application no. CN201410114618.0, filed on Mar. 25, 2014, the entire content of which is incorporated herein by reference.

FIELD OF THE DISCLOSURE

The present disclosure relates to the field of semiconductor manufacturing technology and, more particularly, relates a coating layer formation method in a photolithographic process.

BACKGROUND

In semiconductor manufacturing, functional integrated circuits can be fabricated on a semiconductor substrate by using a series of processes such as photolithography, etching, doping, deposition, planarizing, and cleaning. Among these processes, the photolithography process is especially important, because it may define areas for performing the etching and/or doping processes.

During the photolithography process, a photoresist layer is formed on a semiconductor substrate by a spin-on-coating technique and fixed or completely cured by a baking process first. Then, the formed photoresist layer may be put in a photolithography machine. Next, the photoresist layer may be exposed, transferring patterns in a mask into the exposed photoresist layer. Finally, the exposed photoresist layer may be baked and developed, forming patterns in the photoresist layer.

However, as the photoresist layer becomes thicker, the uniformity of the thickness may decrease significantly. Thus, the subsequent exposure process and other processes may be impacted. For example, the line width may change during the exposure process. Thus, the semiconductor manufacturing yields may decrease. Similarly, when forming other coating layers (e.g., polyimide) on the semiconductor substrate using the spin-on-coating technique, as the thickness of the coating layer increases, the thickness uniformity may decrease. The disclosed methods are directed to solve one or more problems set forth above and other problems.

BRIEF SUMMARY OF THE DISCLOSURE

One aspect of the present disclosure provides a photolithographic method for forming a coating layer. The method includes spraying coating material having a first flowability to a top surface of a provided semiconductor substrate, and performing a first spin coating process by rotating the semiconductor substrate with a first spin speed to form an initial coating layer covering the top surface of the semiconductor substrate. The method also includes performing a first baking process to the initial coating layer to form a first material layer having a second flowability and a second material layer having a third flowability. The second flowability is less than the first flowability and the third flowability is larger than the second flowability but less than the first flowability. Further, the method includes performing a second spin coating process by rotating the semiconductor substrate with a second spin speed to drive the coating material in the second material layer flowing on the surface of the first material layer to form a third material layer with a uniform thickness, and performing a second baking process to the first material layer and the third material layer to form a final coating layer on the top surface of the semiconductor substrate.

Another aspect of the present disclosure provides a photolithographic method for forming a coating layer. The method includes spraying coating material having a first flowability to a top surface of a provided semiconductor substrate, performing a first spin coating process with a first spin speed and performing a first baking process simultaneously to form a first material layer having a second flowability and a second layer having a third flowability, performing a second spin coating with a second spin speed to drive the coating material in the second material layer flowing on the surface of the first material layer to form a third material layer with a uniform thickness, and performing a second baking process to the first material layer and the third material layer to form a final coating layer on the top surface of the semiconductor substrate.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Reference will now be made in detail to exemplary embodiments of the invention, which are illustrated in the accompanying drawings. Wherever possible, the same reference numbers will be used throughout the drawings to refer to the same or like parts. It is apparent that the described embodiments are some but not all of the embodiments of the present invention. Based on the disclosed embodiments, persons of ordinary skill in the art may derive other embodiments consistent with the present disclosure, all of which are within the scope of the present invention.

As illustrated in the background section, as the thickness of the to be formed photoresist layer or other coating layers increases, the thickness uniformity of the formed photoresist layer or other coating layers may decrease. Thus, the production yields may be impacted.

Figure 1:
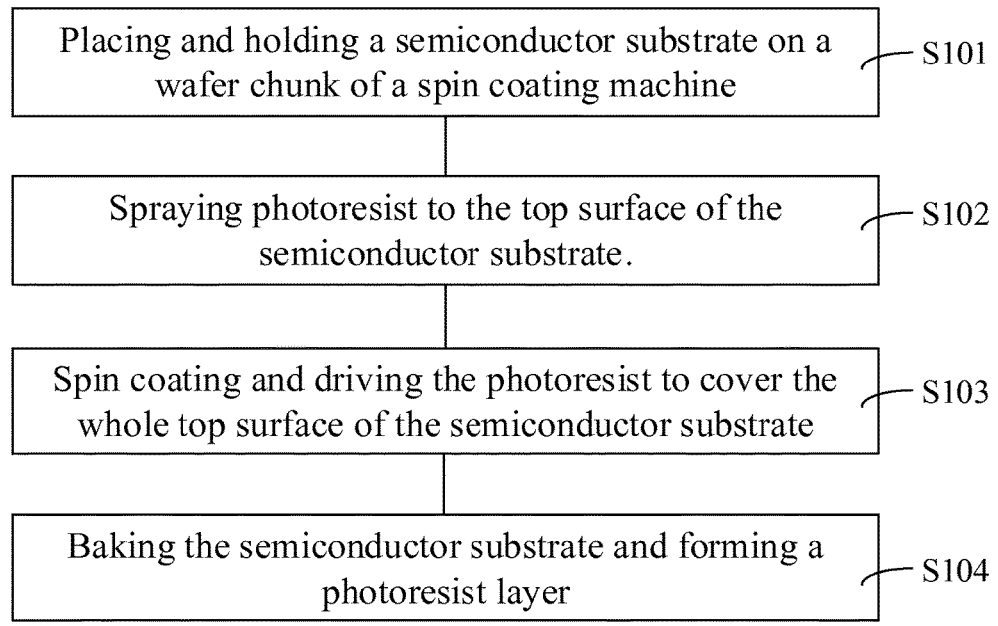
FIG. 1 illustrates a flow chart of an exemplary photoresist layer formation method.

FIG. 1 illustrates a flow chart of an exemplary photoresist layer formation method. As shown in FIG. 1, the process for forming a photoresist layer may include the following steps:

Step S101, placing a semiconductor substrate on a wafer chunk of a spin coating machine, holding the semiconductor substrate by vacuum.

Step S102, spraying photoresist to the top surface of the semiconductor substrate. More specifically, a nozzle filled with the photoresist may be moved to above the semiconductor substrate, and may spray the photoresist to the top surface of the semiconductor substrate. The semiconductor substrate may be in a stationary status.

Step S103, spin coating and driving the photoresist to cover the whole top surface of the semiconductor substrate. More specifically, the wafer chunk may be rotated by a motor. Thus, the semiconductor substrate fixed on the wafer chunk may rotate together. Photoresist may spread to the edge region of the semiconductor substrate because of a centrifugal force and may cover the whole top surface of the semiconductor substrate.

Step S104, baking the semiconductor substrate to evaporate the solvent in the photoresist, forming a photoresist layer covering the top surface of the semiconductor substrate.

However, under the impact of the centrifugal force generated by the rotation of the semiconductor substrate, the photoresist may aggregate more in the edge region while aggregate less in the central region of the semiconductor substrate. Thus, the surface of the finally formed photoresist layer may have a concaved shape. That is, the thickness of the photoresist layer formed in the edge region of the semiconductor substrate may be larger than the thickness of the photoresist layer formed in the central region of the semiconductor substrate.

Further, to form a thicker photoresist layer, more photoresist may be sprayed on the semiconductor substrate. As more photoresist is spayed on the semiconductor substrate, during the subsequent spin coating process, the quantity of the photoresist aggregating at the edge region of the semiconductor substrate may be significantly different from the quantity of the photoresist aggregating at the central region of the semiconductor substrate because of an increased centrifugal force. Thus, the finally formed photoresist layer may have an obvious variation in thickness. More specifically, the thickness of the photoresist layer formed in the edge region may be significantly larger than the thickness of the photoresist layer formed in the central region. As the photoresist layer thickness uniformity decreases, the production yields may decrease.

Thus, this disclosure provides an improved photoresist layer formation method. In this method, the photoresist layer may be formed by a double coating method. The formed photoresist layer may be relatively thick, but the thickness of the formed photoresist layer may be more uniform. The double coating method for forming a photoresist layer may include spraying a first photoresist material on the top surface of the semiconductor substrate; performing a first spin coating and driving the first photoresist material to cover the whole top surface of the semiconductor substrate; and baking the first photoresist material and forming a first photoresist layer.

The double coating method for forming a photoresist layer may further include spraying a second photoresist material on the surface of the first photoresist layer; performing a second spin coating process and driving the second photoresist material to cover the whole surface of the first photoresist layer, and baking the second photoresist material and forming a second photoresist layer. The first photoresist layer and the second photoresist layer together form the final photoresist layer. The thickness of the final photoresist layer is the sum of the thickness of the first photoresist layer and the second photoresist layer.

The photoresist layer formed by the double coating method may be relatively thick, and may have an improved thickness uniformity. However, during the spin coating process, certain amount of photoresist may be thrown out of the semiconductor substrate surface. Because the photoresist material is sprayed twice (the first photoresist material and the second photoresist material) to the semiconductor substrate, during the spin coating process, more photoresist may be thrown out of the semiconductor substrate. Thus, the photoresist layer formation process may consume a large amount of photoresist, resulting in a production cost increase and generating more wastage. Further, because more photoresist is thrown out of the semiconductor substrate, the manufacturing equipment may get contaminated more easily.

Thus, according to the disclosed embodiments, after spraying the coating material on the top surface of the semiconductor substrate, a first spinning process, also referred to as a first spin coating process, is performed to drive the coating material having a flowability on the semiconductor substrate to flow to cover the whole top surface of the semiconductor substrate. Then, a first baking process is performed to the semiconductor substrate, forming a first material layer and a second material layer. Next, a second spinning process, also referred to as a second spin coating process, is performed, driving the coating material in the second material layer to flow on the surface of the first material layer, until a uniformly-thicknessed third material layer is formed. After the second spin coating process, a second baking process is performed to the semiconductor substrate, forming a coating layer on the top surface of the semiconductor substrate.

Thus, in the disclosed photolithographic method for forming a coating layer, by performing the first baking process, the coating material may form the cured first material layer and the flowable second material layer. The first material layer may have a uniform thickness. Further, by performing the second spin coating process, the coating material in the second material layer may be redistributed and may form the uniformly-thicknessed third material layer. Thus, after performing the second baking process, the uniform thickness coating layer may be formed. In addition, when applying this method to fabricate certain relatively thick coating layers, the formed coating layer may be uniform in thickness. Thus, semiconductor manufacturing yields may be enhanced.

Figure 18:
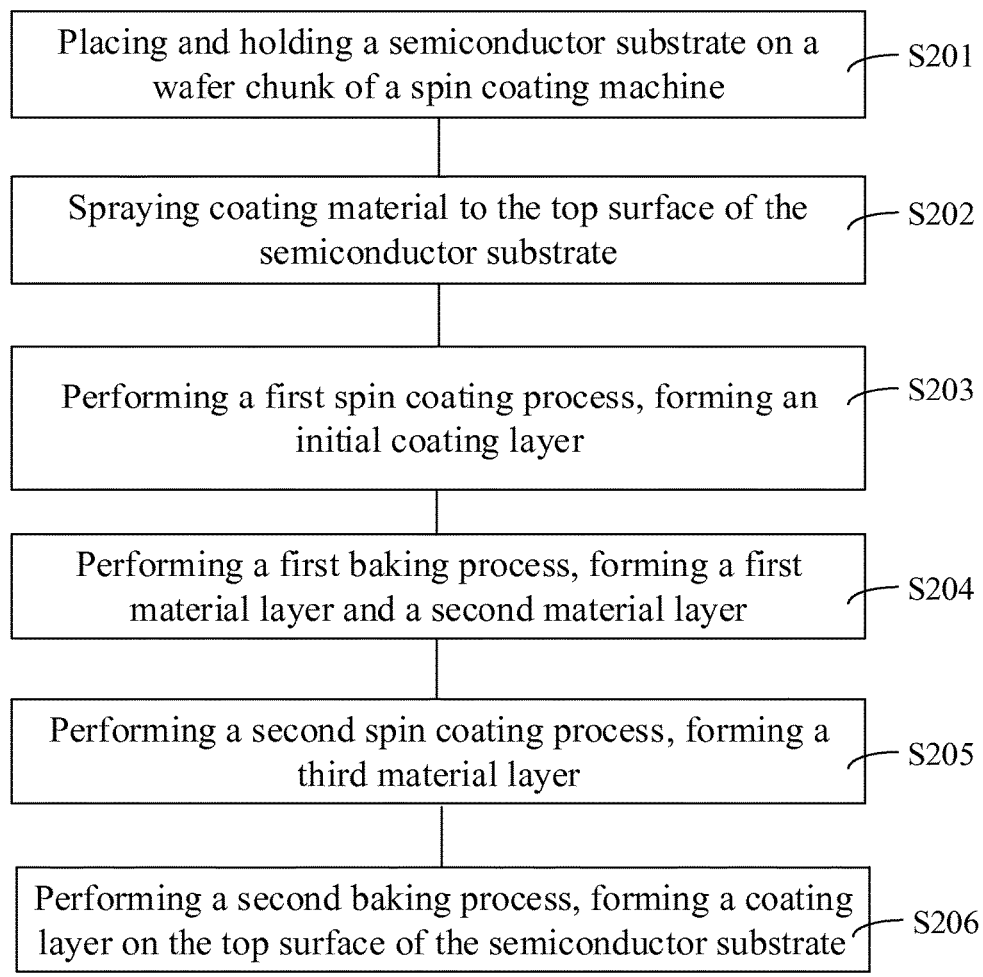
FIG. 18 illustrates a flow chart of an exemplary photolithographic method for forming a coating layer consistent with the disclosed embodiments.

FIG. 18 illustrates a flow chart of an exemplary photolithographic method for forming a coating layer consistent with the disclosed embodiments. FIGS. 2-6 illustrate sectional views of a semiconductor structure corresponding to certain states of an exemplary coating layer formation method consistent with the disclosed embodiments.

Figure 2:
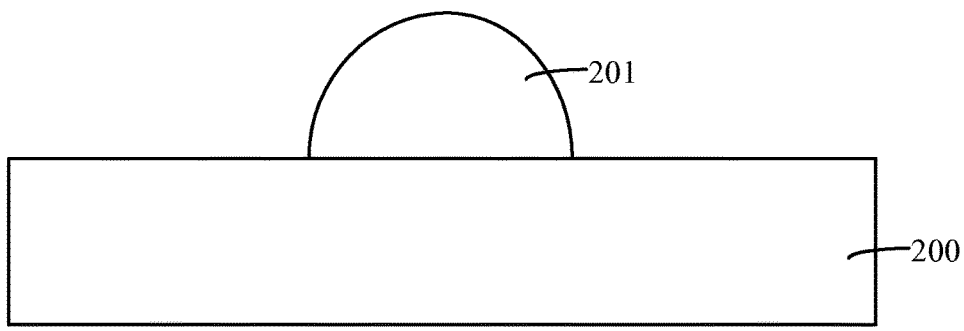
FIGS. 2-6 illustrate sectional views of a semiconductor structure corresponding to certain states of an exemplary photolithographic method for forming a coating layer consistent with the disclosed embodiments.

As shown in FIG. 18, at the beginning of the coating layer formation process, a semiconductor substrate is provided and is hold on a wafer chunk of a spin coating machine (S201). Then coating material is sprayed to the top surface of the semiconductor substrate (S202). FIG. 2 illustrates sectional views of a semiconductor structure corresponding to certain states of an exemplary coating layer formation method consistent with the disclosed embodiments.

As shown in FIG. 2, a semiconductor substrate 200 is provided, and coating material 201 is sprayed to the top surface of the semiconductor substrate 200. More specifically, the semiconductor substrate 200 may be a bare wafer, or may be a substrate having certain semiconductor structures or devices. The semiconductor substrate 200 may be made of silicon, germanium, silicon germanium, silicon on insulator, germanium on insulator, glass, or other materials. The top surface of the semiconductor substrate 200 may need to be coated with the coating material 201 to form a coating layer. The semiconductor substrate includes a central region (center area of the semiconductor substrate) and an edge region (edge area of the semiconductor substrate).

In one embodiment, the coating material 201 may be a photoresist. Thus, a photolithography process may be performed on the substrate 200 subsequently. In certain other embodiments, the coating material 201 may be other materials that compatible with the spin coating process. For example, the coating material 201 may be polyimide. Further, the coating material 201 may contain certain amount of solvent making the coating material 201 having a first flowability. Thus, during the subsequent spin coating process, the coating material 201 may flow on the top surface of the semiconductor substrate 200, and may cover the top surface of the substrate 200.

More specifically, the semiconductor substrate 200 may be placed on the wafer chunk of a spin coating machine. The wafer chunk may have certain vacuum structures (e.g., vacuum holes and/or vacuum trenches). The semiconductor substrate 200 may be held steady by these vacuum structures.

Next, the coating material 201 may be sprayed onto the top surface of the semiconductor substrate 200. The coating material 201 may be a photoresist. More specifically, a nozzle filled with the photoresist material may be moved to above or close to the central region of the semiconductor substrate 200. The nozzle may keep certain distance from the top surface of the semiconductor substrate 200. The semiconductor substrate 200 may be in a stationary status. Then the coating material 201 may be sprayed onto the top surface of the semiconductor substrate 200 in or close to the central region.

In one embodiment, the coating material 201 is located in the central region on the top surface of the semiconductor substrate 200. The quantity of the sprayed coating material 201 may be determined by the thickness of the photoresist layer to be formed. The detailed type of photoresist may be determined by photolithography process parameters (e.g., line width), and by the etching process parameters.

Moreover, prior to spraying the coating material 201, certain surfactant (or primer) may be sprayed to the top surface of the semiconductor substrate. The surfactant may reduce the flow resistance on the top surface of the semiconductor substrate, thus the photoresist may flow more easily during the subsequent spin coating process. Thereby, the amount of the consumed photoresist may be reduced, and the cost may be reduced accordingly.

More specifically, a nozzle filled with the surfactant material may be moved to above the top surface of the semiconductor substrate 200. The nozzle may keep certain distance from the top surface of the semiconductor substrate 200. The semiconductor substrate 200 may be in a stationary status. Then the surfactant material may be sprayed to the top surface of the semiconductor substrate 200 located in or close to the central region. Next, the semiconductor substrate 200 may be rotated together with the wafer chunk. Under a centrifugal force, the surfactant material may spread to the edge region along the top surface of the semiconductor substrate 200. Finally, the surfactant material may cover the entire top surface of the semiconductor substrate 200. The excessive surfactant material is thrown out of the semiconductor substrate 200 during the spin process.

Figure 3:
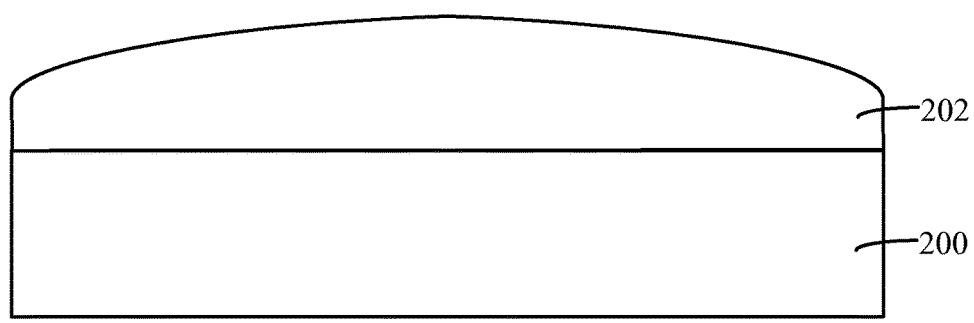

Returning to FIG. 18, a first spin coating process is performed to form an initial coating layer (S203). FIG. 3 illustrates sectional views of a semiconductor structure corresponding to certain states of an exemplary coating layer formation method consistent with the disclosed embodiments.

As shown in FIG. 3, an initial coating layer 202 coving the whole top surface of the semiconductor substrate may be formed after perform the first spin coating process.

More specifically, during the first spin coating process, the semiconductor substrate may be rotated with a first spin speed. The coating material 201 (FIG. 2) may cover the entire top surface of the semiconductor substrate 200 and may form an initial coating layer 202.

By rotating the semiconductor substrate 200, the centrifugal force may drive the coating material 201 flowing toward the edge region of the semiconductor substrate 200. The coating material 201 may spread on the top surface of the semiconductor substrate 200, and may form the initial coating layer 202 on the top surface of the semiconductor substrate 200. During rotating the semiconductor substrate 200, gas may be blown to the backside of the semiconductor substrate 200 (a surface of the semiconductor substrate 200 without forming the initial coating layer 202). More specifically, the gas may be blown close to the edge region on the backside of the semiconductor substrate 200. The blown gas may prevent the coating material 201 from flowing toward the backside of the semiconductor substrate 200. The gas may be nitrogen or other inert gases.

In certain embodiments, the gas may be blown in a direction perpendicular to the backside of the semiconductor substrate 200. After the gas hitting the backside, the gas may flow toward the edge along the back surface of the semiconductor substrate 200. The formed gas flow may prevent the coating material 201 from flowing to the backside of the semiconductor substrate 200 during the first spin coating process. Thus, the photoresist contamination to the back surface of the semiconductor substrate 200 may be reduced or eliminated. In other embodiments, the direction of the blown gas may be inclined to the back surface of the semiconductor substrate 200.

Further, the first spin speed used for performing the first spin coating process may be a relatively slow speed. During the spin coating process, the amount of the coating material 201 flowed to the edge region of the semiconductor substrate 200 may be proportional to the centrifugal force. Thus, when the first spin speed is slow, the amount of the coating material 201 flowed to the edge region of the semiconductor substrate 200 may be less because of the smaller centrifugal force. Thereby, the formed initial coating layer 202 may be thicker in the central region and thinner in the edge region. During a subsequent second spin coating process, the flowable initial coating layer 202 with certain thickness may flow to the edge region and may finally form a uniformly-thicknessed coating layer.

Further, certain amount of the coating material 201 may be thrown out of the semiconductor substrate 200 during the first spin coating process. If the first spin coating speed is too fast, a large amount of the coating material 201 may be thrown out of the semiconductor substrate. Thus, the amount of the coating material 201 left on the top surface of the semiconductor substrate 200 may be not enough for forming the desired thicknessed coating layer. Thereby, the first spin coating process may use a relative low speed. After the first spin coating process, there may be enough coating material 201 left on the top surface of the semiconductor substrate 200, and is good for forming the desired thicknessed coating layer.

Further, if the first spin speed used in the first spin coating process is too fast, the formed initial coating layer 202 may be thicker in the edge region and thinner in the central region. During the subsequent second spin coating process, because the impact from the centrifugal force, the certain thicknessed flowable initial coating layer 202 may be hard to flow back to the central region. Thus, the relatively thinned central region in the initial coating layer 202 may not be filled and may have defects. The finally formed coating layer may still have the problem of being thicker in the edge region and thinner in the central region.

According to the above analysis, the first spin speed may range from 400 rpm (revolutions per minute) to 1000 rpm. In other embodiments, the first spin speed may be determined based on the viscosity of the coating material used in the actual process.

Figure 4:
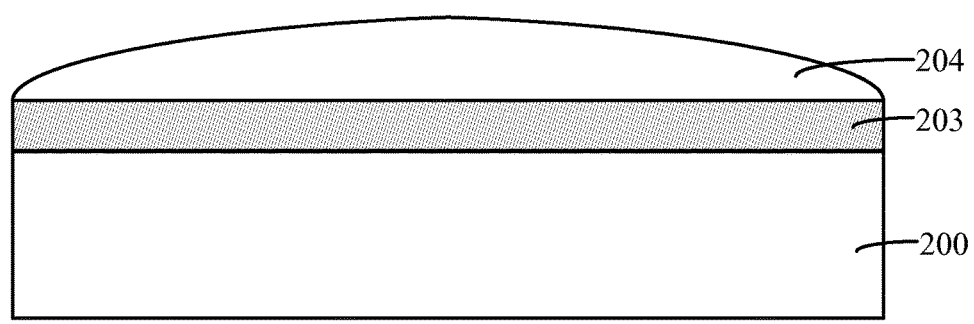

Returning to FIG. 18, a first baking process is performed to form a first material layer and a second material layer (S204). FIG. 4 illustrates sectional views of a semiconductor structure corresponding to certain states of an exemplary coating layer formation method consistent with the disclosed embodiments.

As shown in FIG. 4, after the first spin coating process, a first baking process may be performed to the coating material layer 201 (FIG. 2) (or the initial coating layer 202 shown in FIG. 3), forming a first material layer 203 and a second material layer 204 on the top surface of the semiconductor substrate successively. The first material layer 203 may have a second flowability. The second material layer 204 may have a third flowability. Further, the second flowability may be smaller than the first flowability, and the third flowability may be larger than the second flowability but less or equal to the first flowability.

More specifically, during the first baking process, solvent in the lower portion of the initial coating layer 202 contacting with the top surface of the semiconductor substrate 200 may be evaporated. Thus, the lower portion of the initial layer 202 may be cured and may form the first material layer 203. The cured first material layer 203 may have a second flowability. And, the second flowability may be smaller than the first flowability. The relatively smaller second flowability may keep the thickness of first material layer 203 constant during a subsequent second spin coating process. And the thickness of the upper portion of the initial coating layer 202 (FIG. 3) having a relatively larger flowability may be reduced during the subsequent second spin coating process. That is, the mass of the initial coating layer 202 (FIG. 3) having a relatively larger flowability may be reduced.

During the second spin coating process, because the first material layer 203 is cured, the thickness of the first material layer may keep unchanged. While, for the second material layer 204, because it may still have a relatively larger flowability, during the subsequent second spin coating process, coating material in the second material layer may flow to the edge region of the semiconductor substrate 200.

Further, because the mass of the flowable initial coating layer 202 may be reduced, the flowable initial coating layer 202 (e.g., the second material layer 204) may be impacted less by the centrifugal force. Thus, the large amount of the second material layer 204 flowing to the edge region may be avoided. The accumulation of the second material layer 204 in the edge region may be prevented. Thereby, the sum of the thickness of the first material layer 203 and the second material layer 204 may be equal in every region.

In addition, during the first baking process, the back surface (the surface opposite to the top surface of the semiconductor substrate 200) of the semiconductor substrate may be heated uniformly. Thus, every region of the semiconductor substrate may obtain the same amount of heat. Accordingly, the initial coating layer 202 may obtain the same quantity of heat in every region. The formed first material layer 203 by the first baking process may have the same thickness in every region. That is, the first material layer 203 has a uniform thickness.

Moreover, if the first baking process lasts too long, or the first baking process uses a temperature that is too high, the formed cured first material layer 203 may be too thick. Thus, the formed second material layer 204 having the relatively larger flowability may be too thin, which may impact on forming a coating layer with a uniform thickness. In certain scenarios, the initial coating layer 202 may be cured completely, and may substantially impact forming the uniform coating layer.

On the other hand, if the first baking process lasts too short, or the first baking process uses a temperature that is too low, the formed cured first material layer 203 may be too thin. And the formed second material layer 204 having the relatively larger flowability may be too thick. After performing the second spin coating process, because the second material layer 204 is too thick, the previously formed coating layer in the edge region of the semiconductor substrate 200 may become thicker.

Thus, according to the disclosed embodiments, the first baking process may be a fast baking process, with a temperature ranging from 60° C. to 200° C., and a baking duration ranging from 1 second to 300 seconds.

Figure 5:
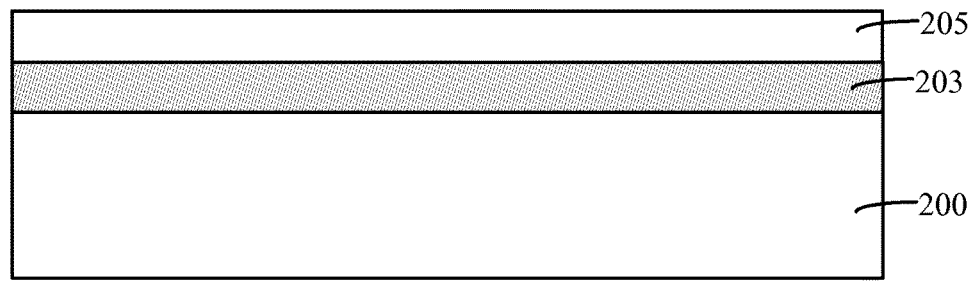

Returning to FIG. 18, a second spin coating process is performed to form a third material layer (S205). FIG. 5 illustrates sectional views of a semiconductor structure corresponding to certain states of an exemplary coating layer formation method consistent with the disclosed embodiments.

As shown in FIG. 5, performing a second spin coating process to the semiconductor substrate 200 using a second spin speed, wherein, the second material layer 204 (FIG. 4) having the third flowability may flow on the surface of the first material layer 203 and may form a third material layer 205 with a uniform thickness.

More specifically, after performing the first baking process, the first material layer 203 on the top surface of the semiconductor substrate 200 may be cured. Thus, during the second spin coating process, the first material layer 203 may not flow. However, the second material layer 204 having the third flowability (larger than the second flowability but smaller than the first flowability) may flow on the surface of the first material layer 203, and may form the third material layer 205.

Further, the second spin speed used to rotate the semiconductor substrate 200 during the second spin coating process may be faster than the first spin speed. Thus, the second material layer 204 located in the central region may flow to the edge region. The surface of the second material layer 204 may be planarized, forming the uniformly-thicknessed third material layer 205.

After the first spin coating process, the second material layer 204 may be thicker in the central region and thinner in the edge region. If the second spin speed is slower than the first spin speed, due to the reduced centrifugal force, the second material layer 204 may have a reduced ability to move from the central region to the edge region. Thus, after the second spin coating process, the second material layer 204 may be still thicker in the central region and thinner in the edge region, which may impact forming the uniformed thicknessed third material layer 205.

According to the above analysis, the second spin speed may be faster than the first spin speed. The second spin speed may range from 1000 rpm to 2000 rpm. In other embodiments, the second spin speed may be determined by considering the viscosity of the coating material and the aptitude of the first spin speed.

Figure 6:
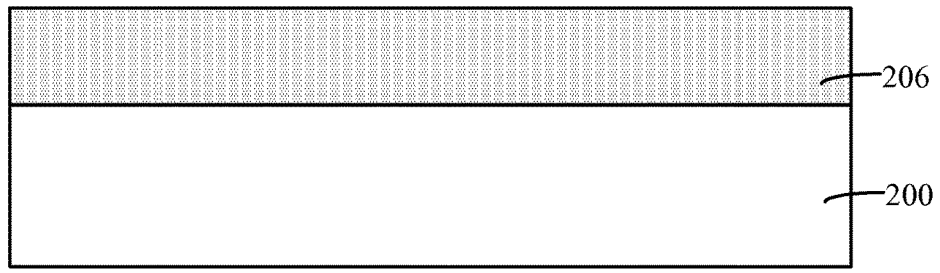

Returning to FIG. 18, further, a second baking process is performed to form a coating layer on the top surface of the semiconductor substrate (S206). FIG. 6 illustrates sectional views of a semiconductor structure corresponding to certain states of an exemplary coating layer formation method consistent with the disclosed embodiments.

As shown in FIG. 6, after the second spin coating process, a second baking process is performed to the first material layer 203 (FIG. 5) and the third material layer 205 (FIG. 5), forming a coating layer 206 on the top surface of the semiconductor substrate 200.

More specifically, during the second baking process, solvent in the first material layer 203 and in the third material layer 205 may be further evaporated. Thus, the first material layer 203 and the third material layer 205 may be solidified. The first material layer 203 and the third material layer 205 may be transformed into the coating layer 206. The coating layer 206 may have an improved adhesion to the top surface of the semiconductor substrate 200.

In one embodiment, the second baking process may be performed with a temperature ranging from 90° C. to 400° C., and a baking duration ranging from 30 seconds to 1000 seconds.

According to the above analysis, the first material layer 203 may have a uniform thickness. After the second spin coating process, the third material layer 205 formed on the surface of the first material layer 203 may also have a uniform thickness. Thus, after evaporating the solvent in the first material layer 203 and the third material layer 205 by performing the second baking process, the uniformly-thicknessed coating layer 206 may be formed.

Figure 7:
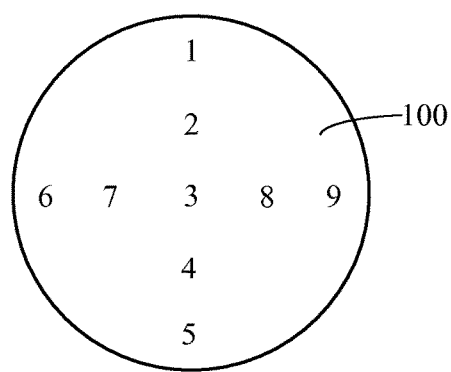
FIG. 7 illustrates a top view of an exemplary semiconductor substrate with certain testing points located on surface consistent with the disclosed embodiments.

To test the performance of the coating layer formed by the disclosed method, photoresist layers formed by the single coating method, the double coating method, and the disclosed method respectively are fabricated and compared. The targeted thickness of the photoresist layer to be formed on the top surface of a semiconductor substrate is 100 μm. FIG. 7 illustrates a top view of the semiconductor substrate with certain testing points on the surface. As shown in FIG. 7, the testing points include testing points 1-9.

Table 1 lists the photoresist layer thickness measured at these testing points locations corresponding respectively to photoresist layers formed by the single coating method, the double coating method, and the disclosed method. Further, Table 1 also lists the average thickness and the thickness variation calculated based on the measured thickness data corresponding to the three photoresist layers respectively. At the end, Table 1 lists the photoresist mass consumed by the single coating method, the double coating method, and the disclosed method respectively.

TABLE 1

| Testing points | Coating layer thickness (single coating method, μm) | Coating layer thickness (double coating method, μm) | Coating layer thickness (disclosed method, μm) |
|---|---|---|---|
| 1 | 95 | 104 | 97 |
| 2 | 101 | 98 | 102 |
| 3 | 107 | 101 | 105 |
| 4 | 105 | 99 | 100 |
| 5 | 97 | 99 | 99 |
| 6 | 93 | 103 | 98 |
| 7 | 100 | 99 | 101 |
| 8 | 103 | 97 | 100 |
| 9 | 96 | 104 | 98 |
| Average thickness (μm) | 99.67 | 100.44 | 100.00 |
| Thickness variation (%) | 7.00 | 3.48 | 3.96 |
| Photoresist usage (g) | 8.5 | 13 | 8.5 |

As shown in Table 1, the photoresist layer formed by the disclosed method has a thickness variation 3.96%, and the photoresist layer formed by the single coating method has a thickness variation 7.00%. Thus, the thickness of the photoresist layer formed by the disclosed method is more uniform. Further, the photoresist layer formed by the disclosed method consumes 8.5 grams photoresist, and the photoresist layer formed by the double coating method consumes 13 grams photoresist. Thus, embodiments consistent with the present disclosure may save cost. The photoresist layer formed by the disclosed method has relatively better uniformity and consumes less photoresist, thus is an optimized option.

This disclosure proves another photolithographic method for forming a coating layer. More specificity, after the first spin coating process but prior the second baking process, the first baking process may be performed and repeated one or more times. Further, after each first baking process, a second spin coating process may be performed. That is the first baking process and the second spin coating process may be performed and repeated alternatively. Thus, prior performing the second baking process, a third material layer having a uniform thickness may be formed. Thereby, a uniformly-thicknessed coating layer may be formed.

FIGS. 8-14 illustrate sectional views of a semiconductor structure corresponding to certain states of another exemplary photolithographic method for forming a coating layer consistent with the disclosed embodiments.

In one embodiment, after the first spin coating process but prior the second baking process, the first baking process may be repeated 3 times. In other embodiments, the first baking process may be repeated different times.

Figure 8:
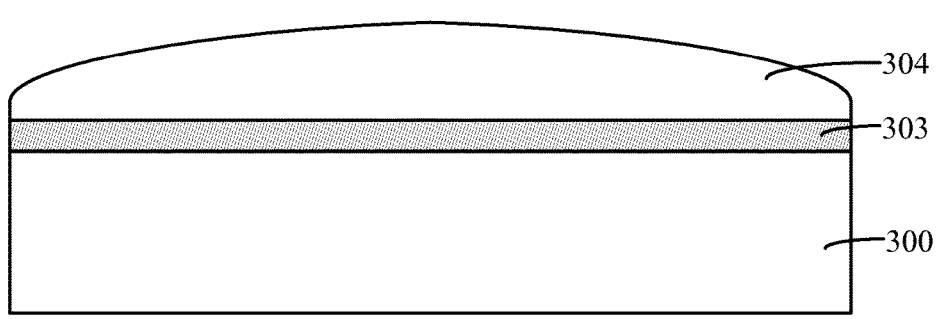
FIGS. 8-14 illustrate sectional views of a semiconductor structure corresponding to certain states of another exemplary photolithographic method for forming a coating layer consistent with the disclosed embodiments.

As shown in FIG. 8, a semiconductor substrate 300 is provided, a second material layer 303 and a fourth material layer 304 are formed on the top surface of the semiconductor substrate 300.

More specifically, a coating material (no shown) may be sprayed to the top surface of the semiconductor substrate 300. The coating material may have a first flowability. Then, a first spin coating process may be performed by using a first spin speed to rotate the semiconductor substrate 300. During the spin coating process, the coating material may cover the whole top surface of the semiconductor substrate, forming an initial coating layer (not shown).

Next, the first baking process may be performed for a first time to bake the coating material. Thus, the second material layer 303 and a fourth material layer 304 may be formed successively on the top surface of the semiconductor substrate. The second material layer 303 may have a second flowability. Moreover, the second flowability may be smaller than the first flowability. The fourth material layer 304 may have a third flowability, and the third flowability may be larger than the second flowability, but equal or less than the first flowability.

The material property and formation process of the semiconductor substrate 300, the coating material, the first spin coating process, the second material layer 303, the fourth material layer 304, and the first baking process are similar with the previous embodiment, wherein the semiconductor substrate 200 (FIG. 2), the coating material 201 (FIG. 2), the first spin coating process, the first material layer, and the first baking process are illustrated, thus, are omitted here.

Figure 9:
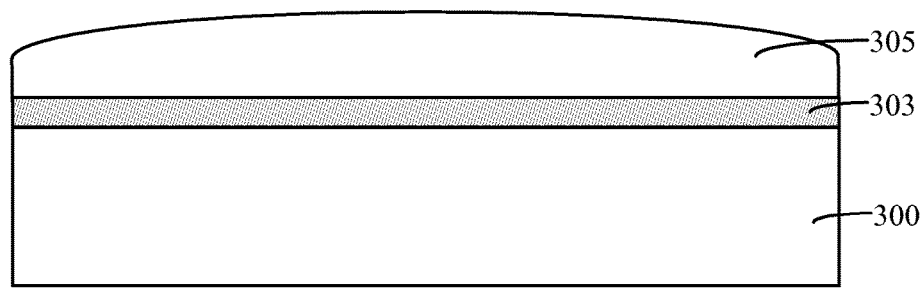

As shown in FIG. 9, further, a second spin coating process is performed for the first time by rotating the semiconductor substrate 300 with a second spin speed, driving the coating material in the fourth material layer 304 (FIG. 8) to flow toward the edge region. Thus, the fourth material layer 304 may be transformed into a fifth material layer 305.

In this embodiment, the process requirements for performing the second spin coating process for the first time may be lower than the process requirements for performing the second spin coating in the previous embodiment. More specifically, after performing the second spin coating for the first time, the fifth material layer 305 may not be required strictly to have a uniform thickness. The fifth material layer 305 may be thicker in the central region and thinner in the edge region.

The second spin speed may be higher than the first spin coating speed. The second spin speed may range from 1000 rpm to 2000 rpm.

Figure 10:
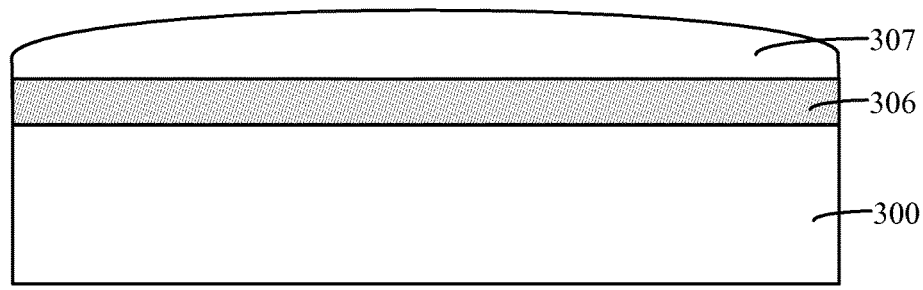

As shown in FIG. 10, the first baking of the semiconductor substrate 300 is performed for a second time. After the baking process, the second material layer 303 (FIG. 9) may have an increased thickness and may be transformed into a sixth material layer 306. The fifth material layer 305 (FIG. 9) may have a reduced thickness and may be transformed into a seventh material layer 307.

When the to-be-formed coating layer is significantly thick, after performing the second spin coating one time, it may still be difficult to form the uniformly-thicknessed third material layer. Thus, the first baking process may be performed for a second time. The cured second material layer 303 may have an increased thickness and may be transformed into the sixth material layer 306. While, the flowable fifth material layer 305 may have a reduced thickness and may be transformed into the seventh material layer 307. Thus, when perform the second spin coating process for a second time subsequently, an eighth material layer having a smaller thickness variation than the fifth material layer 305 may be formed. The uniformly-thicknessed third material layer may be formed step by step.

When performing the first baking for the first time, the baking process may be may be a fast baking process. The detailed process parameter of the first time first baking process may be determined by the actual process requirements.

Figure 11:
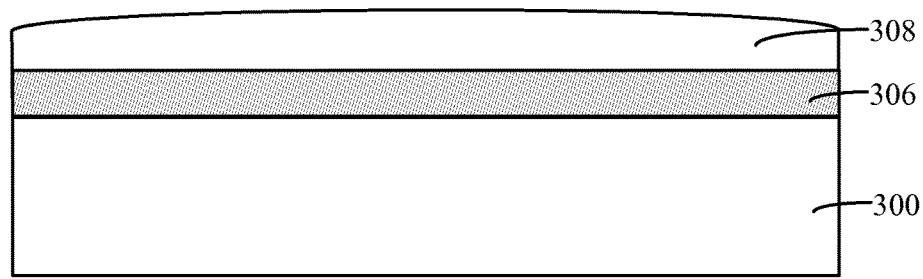

As shown in FIG. 11, the second spin coating process is performed for the second time to the semiconductor substrate 300 to transform the seventh material layer 307 (FIG. 10) into the eighth material layer 308.

After performing the second spin coating process for the second time, the eighth material layer 308 having a smaller thickness variation than the seventh material layer 307 may be formed. The formed eighth material layer 308 may have a reduced thickness variation in every region, and is good for forming a uniformly-thicknessed coating layer. Further, the spin speed used in the second time spin coating process may be higher than the spin speed used in the first time spin coating process.

Figure 12:
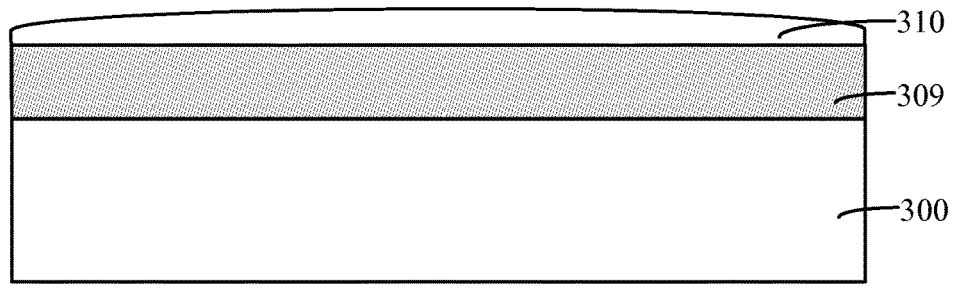

As shown in FIG. 12, performing the first baking of the semiconductor substrate 300 for a third time. During the third time baking process, the sixth material layer 306 (FIG. 11) may have an increased thickness and may be transformed into a first material layer 309. The eighth material layer 308 (FIG. 11) may have a reduced thickness and may be transformed into a ninth material layer 310.

The function of the third time first baking process is similar with the second time first baking process as illustrated before, thus is omitted here.

Figure 13:
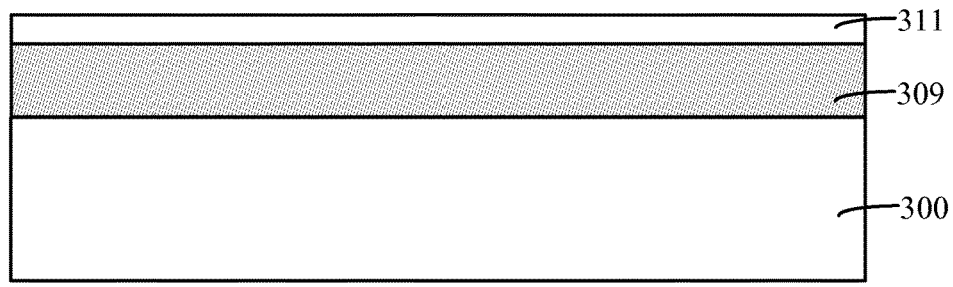

As shown in FIG. 13, the second spin coating process is performed for the third time to the semiconductor substrate 300, transforming the ninth material layer 310 (FIG. 12) into an uniformly-thicknessed third material layer 311.

During the third time second spin coating process, coating material in the ninth material layer 310 may be redistributed on the surface of the first material layer 309, and may be further planarized to form the uniform thicknessed third material layer 311. The spin speed for the third time second spin coating process may be higher than the spin speed for the second time second spin coating process.

Figure 14:
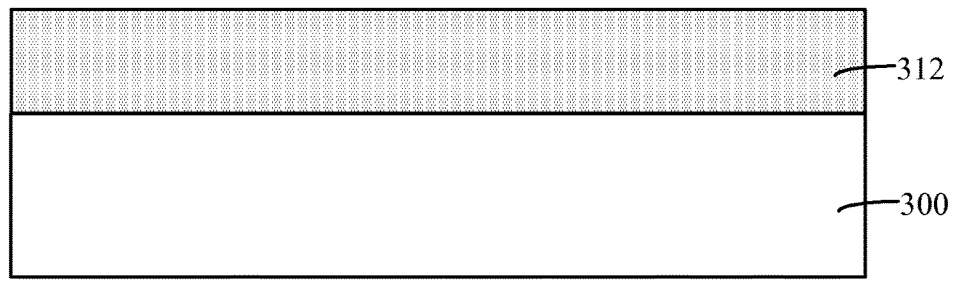

As shown in FIG. 14, after the third time second spin coating process, the second baking process may be performed to bake the first material layer 309 (FIG. 13) and the third material layer 311 (FIG. 13). Thus, a coating layer 312 may be formed on the top surface of the semiconductor substrate 300.

The function and process parameters of the second baking process are similar with the second baking process in the previous embodiment illustrated before, thus are omitted here. The thickness of the formed coating layer 312 may range from 50 μm to 5000 μm.

According to the above illustrations, after the first spin coating process but prior to the second baking process, the first baking process may be repeated three times. Moreover, after each first baking process, the second spin coating process may be performed. In other embodiments, after the first spin coating process but prior to the second baking process, the first baking process may be repeated different times, such as one, two, five, eight, etc. depending on the actual process requirements.

In addition, after each first baking process, the second spin coating process may be performed. For example, when a to-be-formed coating layer is too thick, performing the second spin coating once may be not able to form the uniformed thicknessed third material layer. Thus, the second spin coating process may be performed multiple times, until the uniformed thicknessed third material layer is formed after the last second spin coating process. The finally formed third material layer may be thick and may have uniform thickness. Thus, the finally formed coating layer may be thick and may have uniform thickness.

This disclosure provides another photolithographic method for forming a coating layer. In this method, the first spin coating process and the first baking process may be performed together to form the cured first material layer and the flowable second material layer. Next, the second spin coating process may be performed, transforming the second material layer into the uniformly-thicknessed third material layer, and forming a uniformly-thicknessed coating layer.

Figure 15:
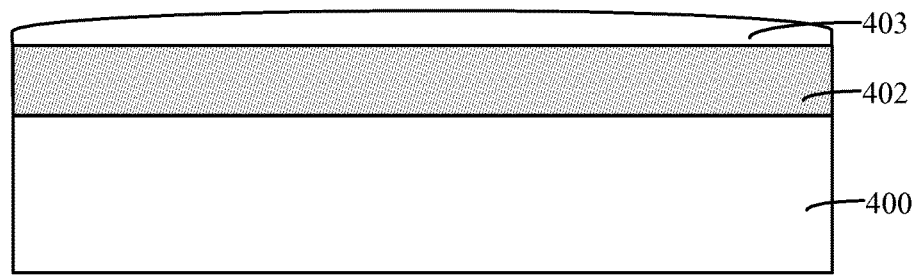
FIGS. 15-17 illustrate sectional views of a semiconductor structure corresponding to certain states of another exemplary photolithographic method for forming a coating layer consistent with the disclosed embodiments.
Figure 16:
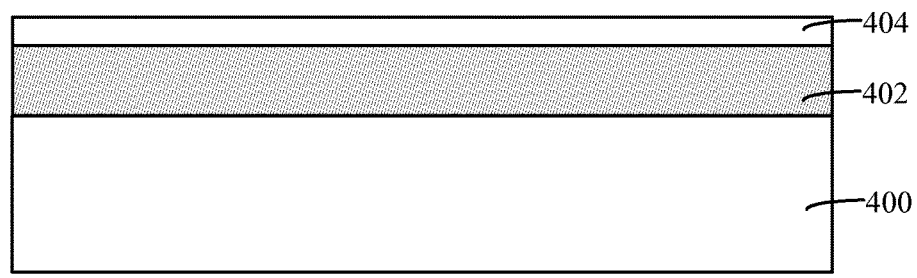
Figure 17:
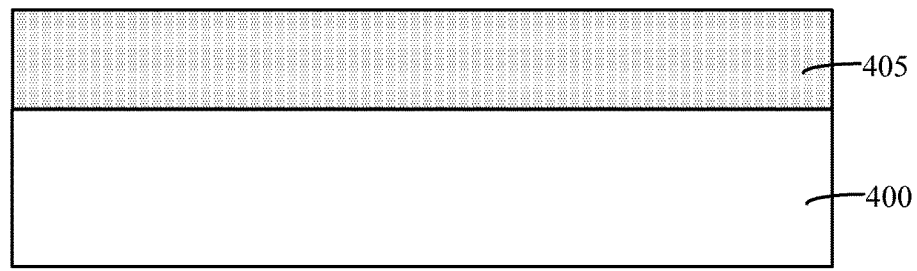

FIGS. 15-17 illustrate sectional views of a semiconductor structure corresponding to certain states of an exemplary photolithographic method for forming a coating layer consistent with the disclosed embodiments.

As shown in FIG. 15, a semiconductor substrate 400 is provided, a first material layer 402 and a second material layer 403 are formed successively on the top surface of the semiconductor substrate 400. More specifically, certain coating material (not shown) may be sprayed to the top surface of the semiconductor substrate 400. The coating material may have a first flowability. Then the first spin coating process may be performed by using a first spin speed to rotate the semiconductor substrate 400. During the spin coating process, the coating material may spread and cover the whole top surface of the semiconductor substrate. In addition, the first baking process may be performed to the semiconductor substrate 400, forming the first material layer 402 and the second material layer 403 on the top surface of the semiconductor substrate 400 successively.

Further, the first material layer 402 may have a second flowability. The second flowability may be smaller than the first flowability. The second material layer 403 may have a third flowability, and the third flowability may be larger than the second flowability, but equal or less than the first flowability. In addition, the first spin coating process and the first baking process may be performed together. That is, during the first spin coating process, a heat treatment may be performed to the semiconductor substrate 400 at the same time. The heat treatment may be performed by using certain heating device set underneath the semiconductor substrate 400.

More specifically, during the first spin process, coating material may spread on the top surface of the semiconductor substrate 400. At the same time, the coating material on the top surface of the semiconductor substrate 400 may be cured, because solvent in the coating material may be evaporated due to the heat treatment. As the heating time increases, portion of the coating material may be cured and may form the first material layer 402.

Further, if the duration of the first baking process is too short, or the temperature is too low, the formed cured first material may be too thin. Thus, the second material layer 403 may contain too much coating material, and is bad for forming the uniformly-thicknessed third material layer after performing a second spin coating process subsequently. On the other hand, if the duration of the first baking process is too long, or the temperature is too high, the formed cured first material may be too thick. Thus, the second material layer 403 may contain too few coating material, and is also bad for forming the uniformly-thicknessed third material layer after performing the second spin coating process subsequently.

Thus, the first baking process may be performed with a temperature ranging from 60° C. to 200° C., and a baking duration ranging from 1 seconds to 300 seconds. The first spin coating process may be performed using a spin speed ranging from 1000 rpm to 3000 rpm, and a spin coating duration ranging from 30 seconds to 300 seconds.

As shown in FIG. 16, performing the second spin coating process by rotating the semiconductor substrate 400 with the second spin speed. During the second spin coating process, coating material in the second material layer 403 (FIG. 15) having the second flowability may flow on the surface of the first material layer 402, and may form a uniformly-thicknessed third material layer 404.

The detailed parameters for the second spin coating process are similar with the second spin coating process used for forming the third material layer 205 (FIG. 5) illustrated in the previous embodiment, thus, are omitted here.

As shown in FIG. 17, after the second spin coating process, performing the second baking process to the first material layer 402 (FIG. 16) and the third material layer 404 (FIG. 16) to from a coating layer 405 on the top surface of the semiconductor substrate 400.

The detailed parameters of the second baking process is similar with the second baking process illustrated in the previous embodiment, thus, are omitted here. During the second baking process, solvent in the first material layer 402 may be further evaporated, and solvent in the third material layer 404 may be evaporated. Thus, the flowability of the first material layer 402 and the third material layer 404 may decrease. The first material layer 402 and the third material layer 404 may be cured, and may form the coating layer 405 on the top surface of the semiconductor substrate 400.

According to the above analysis, embodiments consistent with the present disclosure may include the following advantages:

First, after spraying the coating material to the top surface of the semiconductor substrate, the first spin coating process is performed to make the coating material cover the whole surface of the semiconductor substrate. Next, the first baking process is performed to bake the semiconductor substrate. Thus, a stacked structure made of the first material layer and the second material layer may be formed. The first material layer may be cured and may have a uniform thickness. Coating material in the second material layer may be still flowable. Then, the second spin coating process may be performed to the semiconductor substrate. Because the first material layer is cured, the first material may not flow. During the second spin coating process, only coating material in the second material layer may flow on the surface of the first material layer. In addition, the second material layer may have a reduced coating material quantity compared to the initial coating layer. Thus, the second material layer may be impacted less by the centrifugal force (centrifugal force may be proportional to the material mass). Thereby, coating material in the second material layer aggregating more in the edge region and less in the central region may be avoided. That is, by driving the second material layer flow on the surface of the first material layer, the second material layer may be easily transformed into the uniformly-thicknessed third material layer. Because the first material layer and the third material layer may all have a uniform thickness, the coating layer formed after the second baking process may have a uniform thickness. The formed coating layer may have an improved thickness uniformity, and the semiconductor manufacturing may have an increased production yields.

Second, in the disclosed embodiments, to form a uniformly-thicknessed coating layer, the coating material may be sprayed to the semiconductor surface for only one time. Thus, large amount of coating material being thrown out of the semiconductor substrate surface may be avoided. The formed coating layer may consume only a minimum amount of coating material. And, the production cost may be reduced.

Third, by performing the first spin coating process and the first baking process together, the time needed for forming the coating layer may be reduced. Thus, the production cycle may be shortened.

Fourth, in certain embodiments, after the first spin coating process but prior the second baking process, the first baking process may be repeated multiple times. In addition, after each first baking process, the second spin coating process may be performed. Thus, before performing the second baking process, the third material layer having a uniform thickness may be formed. Further, the disclosed photolithographic method may be used for forming relative thick (e.g., 50 μm~5000 μm) coating layers. After repeating the first baking and the second spin coating process multiple times, the formed coating layer may have an improved thickness uniformity.

Embodiments consistent with the current disclosure provide a photolithographic method for forming a coating layer. Other applications, advantages, alternations, modifications, or equivalents to the disclosed embodiments are obvious to those skilled in the art. It is intended that the specification and examples be considered as exemplary only, with a true scope and spirit of the invention being indicated by the claims.

What is claimed is:

1. A photolithographic method for forming a coating layer, comprising:
    spraying a coating material having a first flowability onto a central region of a top surface of a semiconductor substrate;
    after spraying the coating material, performing a first spinning process by rotating the semiconductor substrate with a first spin speed to form an initial coating layer covering the entire top surface of the semiconductor substrate;
    performing a first baking process to the initial coating layer to form a first material layer having a second flowability and a second material layer having a third flowability, wherein the third flowability is larger than the second flowability but less than the first flowability, and the second material layer is on the first material layer;
    after forming the second material layer on the first material layer by the first baking process, performing a second spinning process by rotating the semiconductor substrate with a second spin speed to drive the coating material in the second material layer having the third flowability to flow on the surface of the first material layer to form a third material layer that is planarized and with a uniform thickness; and
    performing a second baking process to the first material layer and the third material layer to form a final coating layer on the top surface of the semiconductor substrate.

2. The method according to claim 1, wherein:
    the first baking process is performed to the semiconductor substrate after the first spinning process.

3. The method according to claim 1, wherein:
    after performing the first spinning process but prior to performing the second baking process, the first baking process is repeated one or more times to form the third material layer with a uniform thickness; and
    after performing each first baking process, the second spinning process is performed.

4. The method according to claim 3, wherein, after performing the first spinning process but prior performing the second baking process, repeating the first baking process further includes:
    performing the first baking process to the semiconductor substrate for a first time to form the second material layer and a fourth material layer successively on the top surface of the semiconductor substrate;
    performing the second spinning process to the semiconductor substrate for a first time to transform the fourth material layer into a fifth material layer;
    performing the first baking process to the semiconductor substrate for a second time, wherein, the second material layer has an increased thickness and is transformed into a six material layer, the fifth material layer has a reduced thickness and is transformed into a seventh material layer;
    performing the second spinning process to the semiconductor substrate for a second time to transform the seventh material layer into an eighth material layer;
    performing the first baking process to the semiconductor substrate for a third time, wherein, the sixth material layer has an increased thickness and is transformed into the first material layer, the eighth material layer has a reduced thickness and is transformed into a ninth material layer; and
    performing the second spinning process to the semiconductor substrate for a third time to transform the ninth material layer into the uniformly-thicknessed third material layer.

5. The method according to claim 4, wherein:
    a spin speed used in performing the second coating process for the second time is larger than a spin speed used in performing the second coating process for the first time, and
    a spin speed used in performing the second coating process for the third time is larger than the spin speed used in performing the second coating process for the second time.

6. The method according to claim 2, wherein:
    the first baking process is a fast baking process having a baking temperature ranging from approximately 60° C. to 200° C., and a baking duration ranging from approximately 1 second to 300 seconds.

7. The method according to claim 1, wherein:
    the second spin speed is faster than the first spin speed.

8. The method according to claim 7, wherein:
    the first spin speed ranges from approximately 400 rpm to 1000 rpm, and the second spin speed ranges from approximately 1000 rpm to 2000 rpm.

9. The method according to claim 1, wherein:
    the coating material is photoresist or polyimide.

10. The method according to claim 1, wherein:
    the formed final coating layer has a thickness ranging from approximately 50 μm to 5000 μm.

11. The method according to claim 1, wherein:
    the second baking process uses a temperature ranging from approximately 90° C. to 400° C., and a baking duration ranging from approximately 30 second to 1000 seconds.

12. The method according to claim 1, wherein:
    during the first and second spinning processes, gas is blown on to the backside of the semiconductor substrate to prevent the coating material flowing to the back surface of the semiconductor substrate.

13. The method according to claim 1, further including:
    prior to spraying the coating material, applying a surfactant material to cover the entire top surface of the semiconductor substrate,
    wherein the coating material is sprayed on the surfactant material.

14. The method according to claim 1, further including:
    performing the second spinning process by merely rotating the semiconductor substrate with the second spin speed to planarize the coating material in the second material layer having the third flowability to form a third material layer with a uniform thickness.

15. A photolithographic method for forming a coating layer, comprising:

spraying a coating material having a first flowability onto a central region of a top surface of a semiconductor substrate;

after spraying the coating material, performing a first spinning process with a first spin speed and performing a first baking process simultaneously to form a first material layer having a second flowability and a second layer having a third flowability and on the first material layer;

after forming the second material layer on the first material layer by the first baking process, performing a second spinning with a second spin speed to drive the coating material in the second material layer having the third flowability to flow on the surface of the first material layer to form a third material layer that is planarized and with a uniform thickness; and performing a second baking process to the first material layer and the third material layer to form a final coating layer on the top surface of the semiconductor substrate.

16. The method according to claim 15, wherein performing the first baking process further includes:

heating underneath the semiconductor substrate to bake the semiconductor substrate during the first spinning process.

17. The method according to claim 15, wherein:

the first spinning process uses a first spin speed ranging from approximately 1000 rpm to 3000 rpm, and a spinning duration ranging from approximately 30 seconds to 3000 seconds.

18. The method according to claim 15, wherein:

the first baking process uses a baking temperature ranging from approximately 60° C. to 200° C., and a baking duration ranging from approximately 1 seconds to 300 seconds.

19. The method according to claim 15, further including:

prior to spraying the coating material, applying a surfactant material to cover the entire top surface of the semiconductor substrate, wherein the coating material is sprayed on the surfactant material.

20. The method according to claim 15, wherein:

the third flowability is greater than the second flowability and less than the first flowability, and the second spin speed is faster than the first spin speed.

* * * * *